United States Patent [19]
Vogel

[11] 3,740,618
[45] June 19, 1973

[54] SEMICONDUCTOR UNIT AND METHOD OF MANUFACTURE THEREOF

[75] Inventor: Xaver Vogel, Nussbaumen, Switzerland

[73] Assignee: Aktiengesellschaft Brown, Boveri & Cie, Baden, Switzerland

[22] Filed: Sept. 14, 1971

[21] Appl. No.: 180,415

[30] Foreign Application Priority Data

Sept. 29, 1970 Switzerland ........................ 14565/70

[52] U.S. Cl. .... 317/234 R, 317/234 P, 317/234 A, 29/589

[51] Int. Cl. ............................ H01l 3/00, H01l 5/00

[58] Field of Search ...................... 317/234, 1, 1.5, 317/4, 6, 11; 29/589

[56] References Cited

UNITED STATES PATENTS

| | | | |
|---|---|---|---|
| 3,447,118 | 5/1969 | Ferree | 317/234 |
| 3,619,473 | 11/1971 | Meyerhoff | 317/234 |
| 3,643,131 | 2/1972 | Scherbaum | 317/234 |
| 3,651,383 | 3/1972 | Livezey et al. | 317/234 |
| 3,661,013 | 5/1972 | Wilcox | 317/234 |

FOREIGN PATENTS OR APPLICATIONS

| | | | |
|---|---|---|---|
| 1,000,023 | 8/1965 | Great Britain | 317/234 |
| 411,966 | 4/1925 | Germany | 317/234 |
| 1,913,229 | 1/1970 | Germany | 317/234 |

OTHER PUBLICATIONS

IBM Technical Disclosure Bulletin, Forming Electrical Contracts; Ahearn; Vol. 11 No. 12 May 1969 pages 1669–1670

*Primary Examiner*—John W. Huckert
*Assistant Examiner*—Andrew J. James
*Attorney*—Pierce, Scheffler & Parker

[57] ABSTRACT

A semiconductor unit which comprises one or more semiconductor elements in disc form assembled between two clamping members which are drawn towards each other by means of clamping bolts which pass through the clamping members and terminate in a bridging yoke. Tightening of the bolts moves the yoke in the direction of the clamping members and this movement is transmitted to one of the clamping members by way of spring means thereby to apply pressure to the semiconductor element. The spring means is provided to allow for movement of the clamping members at they heat up and expand during operation of the semiconductor unit.

3 Claims, 1 Drawing Figure

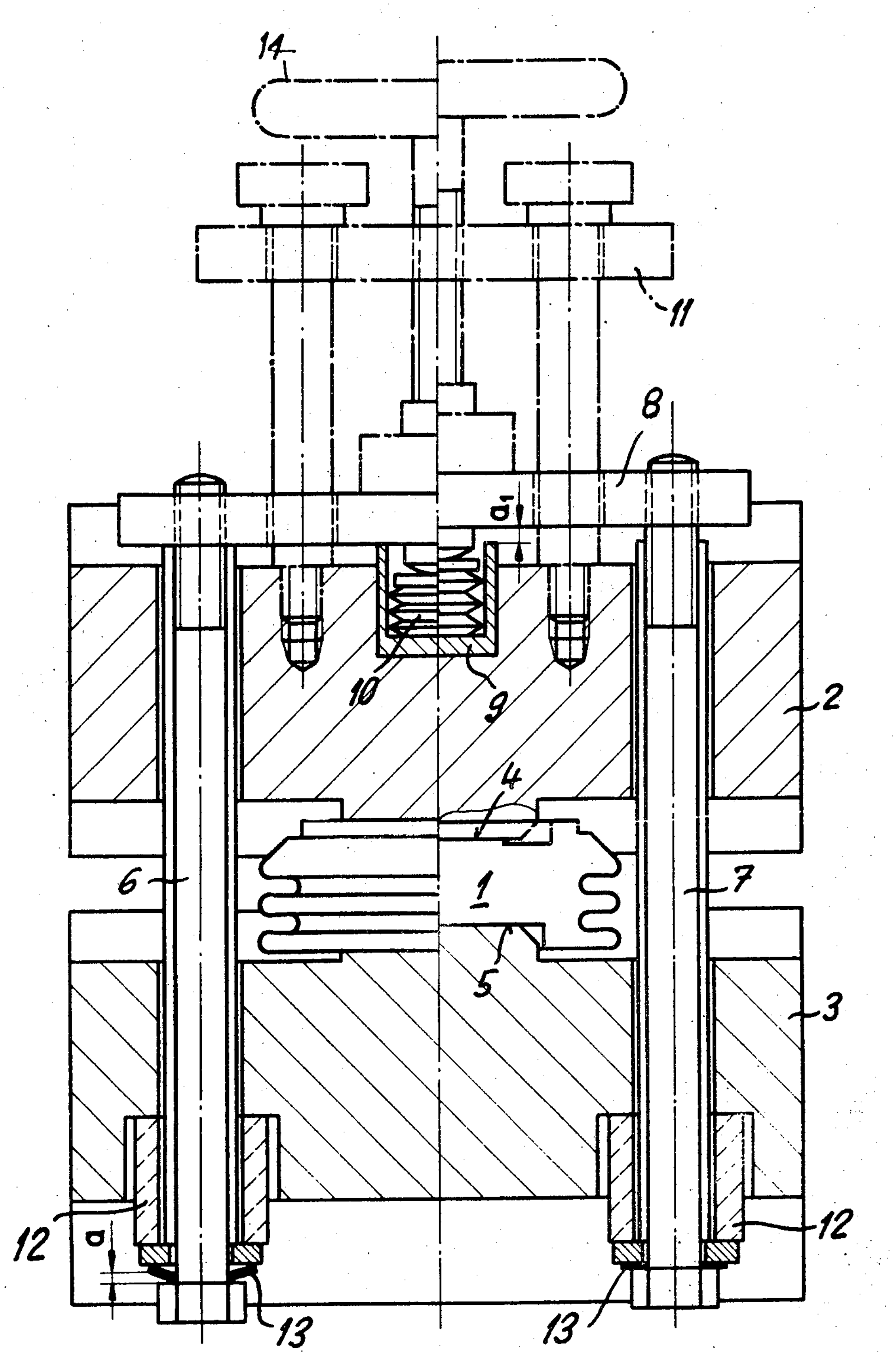
14
11
8
$a_1$
10
9
2
4
6
1
7
5
3
12
a
13
13
12

SEMICONDUCTOR UNIT AND METHOD OF MANUFACTURE THEREOF

The present invention relates to a semiconductor unit comprising one or more semiconductor devices which are arranged between clamping elements, as well as to a method of manufacturing such a unit.

Already, semiconductor units with a disc-shaped semiconductor device which is held between two cooling members which serve simultaneously to supply the current, are known, but all these semiconductor units require that the clamping force necessary for proper current transfer, is adjusted by means of the tightening torque of the clamping bolts.

However, the tightening torque is dependent upon numerous factors which cannot be precisely determined so that precise adjustment of the clamping force is extremely difficult to achieve and in any case is virtually impossible to measure subsequently.

Also, a semiconductor unit is known in which it has been attempted to overcome this drawback by employing fixed preset spring deflection. However, this semiconductor unit has the drawback that when assembling the individual components, a highly undesirable torque is exerted upon the semiconductor device.

The object of the present invention is to create a semiconductor unit which is free of these drawbacks.

The semiconductor unit in accordance with the invention is characterized in that the individual semiconductor device abuts at each side against a clamping element, at least two mutually parallel clamping bolts extending perpendicularly to the plane of the disc or wafer of the semiconductor device, being provided and being attached to one another at one end, through a yoke; in that the yoke is supported against a neighboring clamping element through spring means; and in that stop means cooperating with the yoke and with said neighboring clamping element are provided which, in the cold condition of the semiconductor unit, have a certain distance from a yoke stop face which is disposed towards the clamping element.

It can also be convenient to arrange for at least one of the clamping elements to be designed as a cooling body.

It is also convenient that between the abutment surface of at least one clamp nut or the head of each clamping bolt, and the abutment surface on the yoke and/or the second clamping element, there is at least one spring washer which is so designed that in the normal operating condition of the semiconductor unit, its deflection is zero, and on assembly, when the yoke is in contact with the stop means, is equal to the desired distance (in the cold condition of the finished, operational unit) between the stop means and the associated stop face of the yoke.

A further object of the invention is a novel method for manufacturing the semiconductor unit in accordance with the invention, which method is characterized in that between the clamping element with the stop means, and the yoke, the spring means are arranged whereupon the yoke is pressed up into contact with the stop means against the force of said spring means, this unit, with the semiconductor device and a second clamping element assembled to form a second unit, a yoke attached by the clamping bolts to the second clamping element, and the abutment surfaces of the clamping nuts or the heads of each clamping bolt, set to a distance such that the yoke stop face bearing against the stop means, on reduction of the pressure acting upon the latter towards the first clamping element, to zero, moves away from the stop means by the desired distance, under the influence of the force exerted by the spring means.

It is convenient in this context if, between the first clamping element, equipped with the stop means, and the yoke, the spring means are arranged and thereafter by means of a clamping device screwed into the first clamping element, the yoke pressed against the force exerted by the spring means, into contact with the stop means on the said clamping element; this unit is then assembled with the semiconductor device and the second clamping element to form a second unit; then in each case at least one spring washer (whose spring deflection corresponds to the desired distance, in the cold condition of the finished, operational semiconductor unit, between the stop means and the associated yoke stop face) is arranged on the clamping bolts; the thus-equipped clamping bolts introduced into the second clamping element which is to be tightened up, pass through the first clamping element and screw into the yoke until the bolt heads abut directly or indirectly against a second clamping element, without exerting any force on and therefore distorting the spring washers; and the clamping device is then released.

The foregoing objects as well as other objects and advantages inherent in the inventive concept will become more clearly understood from the following detailed description of a preferred embodiment thereof and its method of manufacture and the accompanying drawing wherein the single view presented is a view in elevation partially sectionalized of the semiconductor unit and the associated clamping elements.

With reference now to the drawing, the disc-shaped semiconductor device 1 will be seen to be clamped between two cooling bodies 2 and 3 which are made from an electrically conductive material and therefore also serve as electrode terminals to which the current supply to the semiconductor is connected.

The semiconductor disc 1, at its opposite faces 4 and 5, bears against respective faces of the cooling bodies 2 and 3 and two clamping bolts 6 and 7 are provided which extend parallel to one another and perpendicularly to the plane of the semiconductor disc 1, being attached together at one of their respective ends in each case, through a yoke 8. The yoke 8 is supported on the neighboring cooling body 2, through a stack 10 of spring washers arranged in a sleeve 9, the sleeve 9 simultaneously functioning also as a fixed stop for the yoke 8. This stop 9, with the semiconductor disc in the cold condition, has a specific distance $a_1$ from the stop face of the yoke 8, which face is disposed towards the cooling body 2.

In order to manufacture this semiconductor unit, the procedure adopted is that the sleeve 9 serving as a stop, together with the stack 10 of spring washers located inside it, is arranged in a recess provided in the first cooling body 2, the sleeve and stack of spring washers being centered along the axis of the semiconductor unit; thereafter the yoke 8 is pressed towards said cooling body 2 until it comes up against the sleeve 9, this by means of a clamping device 11 screwed into the cooling body 2 and in fact against the force exerted by the stack 10 of spring washers; this unit is then assembled together with the semiconductor disc 1 and the second cooling body 3, to form a second unit, the insulating sleeves 12 are then placed in position and, subsequently, the clamping bolts 6 and 7, each with a spring washer 13, are screwed into the yoke 8 until the boltheads bear against the second cooling body 3 through the medium of the spring washers 13 and the insulating sleeves 12, this without distorting the spring washers 13 (lefthand side of the drawing). The spring washers 13 are so dimensioned that their maximum spring deflection $a$ corresponds to the desired distance $a_1$ between the sleeve 9 and the yoke 8.

At this point, the clamping device 11 is released by operation of the rotatable handwheel 14 again, whereupon the stack 10 of spring washers forces the yoke 8 away from the first cooling body 2 until the spring washers 13 arranged on the clamping bolts 6 and 7 are flattened (righthand side of the drawing). The spring deflection $a$ is now zero and is available between the sleeve 9 and the yoke 8 (distance $a_1$) for the thermal expansion of the cooler.

It is possible with this design, without using a measuring device, and in a very simple manner, to adjust the clamping force acting upon the semiconductor device very accurately, indeed without any possibility of an undesired torque acting upon the semiconductor device 1 during assembly.

I claim:

1. A semiconductor unit comprising at least one semiconductor element in disc form, a pair of clamping members in contact respectively with opposite faces of said semiconductor disc, a plurality of clamping bolts, said bolts being parallel to each other and extending through bores provided in said clamping elements in a direction perpendicular to the plane of said semiconductor element for applying a compressive force thereto, a spring washer located on each of said bolts at one end thereof adjacent one of said clamping members, a yoke located adjacent the face of the other clamping member and which interconnects the opposite ends of said bolts, compression spring means interposed between said yoke and said other clamping member for transmitting a compressive force from said yoke through said other clamping member to said semiconductor element, and stop means interposed between said yoke and said other clamping member and which define a predetermined travel distance for said yoke in the direction of said other clamping member and a corresponding compression of said spring means, the deformation of said spring washers in the axial direction of said bolts between an initial unstressed state and a flattened state being equal to the said travel distance of said yoke.

2. A semiconductor unit as defined in claim 1 wherein said spring means is constituted by a stack of spring washers located within a sleeve set into a recess provided in said other clamping member, and wherein the end of said sleeve projecting from the face of said other clamping member constitutes said stop means which establishes the travel distance for said yoke when compressing said spring means, said sleeve and stack of spring washers being centered along the axis of said semiconductor unit.

3. A method of manufacturing a semiconductor unit as defined in claim 1 which comprises the steps of pressing and holding said yoke into engagement with said stop means against a counter action of said spring means to form with said other clamping member a sub-assembly, assembling said sub-assembly together with said semiconductor element and the remaining clamping member and said clamping bolts, tightening said clamping bolts until all axial play has been removed therefrom and the spring washers thereon are snug but not stressed, and then releasing the pressure applied to said yoke whereupon part of the compression force stored in said spring means is released and converted into a tensional stress in said bolts resulting in a flattening of said spring washers.

* * * * *